(12) United States Patent
Ozeki et al.

(10) Patent No.: US 10,389,317 B2
(45) Date of Patent: Aug. 20, 2019

(54) DIFFERENTIAL AMPLIFIER CIRCUIT AND RADAR DEVICE

(71) Applicant: Panasonic Intellectual Property Management Co., Ltd., Osaka (JP)

(72) Inventors: Toshiaki Ozeki, Osaka (JP); Jun'ichi Naka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 375 days.

(21) Appl. No.: 15/465,583

(22) Filed: Mar. 21, 2017

(65) Prior Publication Data

US 2017/0310292 A1 Oct. 26, 2017

(30) Foreign Application Priority Data

Apr. 22, 2016 (JP) ................................ 2016-086492

(51) Int. Cl.
*H03F 3/45* (2006.01)
*H03F 3/193* (2006.01)

(52) U.S. Cl.
CPC ......... *H03F 3/45251* (2013.01); *H03F 3/193* (2013.01); *H03F 3/45197* (2013.01);
(Continued)

(58) Field of Classification Search
CPC .......... H03F 3/189; H03F 3/193; H03F 3/195; H03F 3/45251; H03F 3/45197;
(Continued)

(56) References Cited

U.S. PATENT DOCUMENTS 6,477,099 B2 * 11/2002 Fischer ............... H03F 3/45183
327/52
6,750,715 B2 * 6/2004 Allott ....................... G06G 7/24
327/307

(Continued)

FOREIGN PATENT DOCUMENTS

JP       61-226882      10/1986
JP    2011-091774       5/2011
(Continued)

*Primary Examiner* — Peter M Bythrow
(74) *Attorney, Agent, or Firm* — McDermott Will & Emery LLP

(57) ABSTRACT

A differential amplifier circuit comprises: first and second input terminals; first and second output terminals; a first transistor comprising a gate terminal connected to the first input terminal; a second transistor comprising a gate terminal connected to the second input terminal; a first resistor connected between the source terminal of the first transistor and the source terminal of the second transistor; a third transistor comprising a drain terminal connected to the source terminal of the first transistor, a gate terminal connected to the drain terminal of the first transistor, and a source terminal connected to the first output terminal; a fourth transistor comprising a drain terminal connected to the source terminal of the second transistor, a gate terminal connected to the drain terminal of the second transistor, and a source terminal connected to the second output terminal; first to fourth current sources; and second and third resistors.

16 Claims, 6 Drawing Sheets

(52) U.S. Cl.
CPC ... *H03F 3/45659* (2013.01); *H03F 2200/294* (2013.01); *H03F 2200/451* (2013.01); *H03F 2203/45082* (2013.01); *H03F 2203/45352* (2013.01)

(58) Field of Classification Search
CPC .......... H03F 3/45659; H03F 2200/294; H03F 2200/451; H03F 2203/45082; H03F 2203/45352
See application file for complete search history.

(56) References Cited

U.S. PATENT DOCUMENTS

| | | | | |
|---|---|---|---|---|
| 7,474,158 | B1* | 1/2009 | Yim | H03F 1/0205 330/310 |
| 2001/0041548 | A1* | 11/2001 | Bult | H03F 3/195 455/252.1 |
| 2002/0050861 | A1* | 5/2002 | Nguyen | H03F 1/3211 330/254 |
| 2002/0149418 | A1* | 10/2002 | Allott | G06G 7/24 327/560 |
| 2003/0141923 | A1* | 7/2003 | Liu | G05F 3/262 327/538 |
| 2005/0270071 | A1* | 12/2005 | Draxelmayr | H03F 3/45183 327/9 |
| 2008/0036536 | A1* | 2/2008 | Khorramabadi | H01F 17/0013 330/252 |
| 2008/0062295 | A1* | 3/2008 | Fujimura | H03F 3/08 348/301 |
| 2011/0096186 | A1* | 4/2011 | Itano | H03F 3/45188 348/222.1 |
| 2012/0071122 | A1* | 3/2012 | Akita | G11O 27/024 455/130 |
| 2015/0054550 | A1* | 2/2015 | Koyama | H03F 1/0261 327/109 |
| 2016/0087594 | A1* | 3/2016 | Chabert | H03D 7/1433 330/261 |
| 2016/0156323 | A1* | 6/2016 | Nasu | H03F 1/223 330/278 |

FOREIGN PATENT DOCUMENTS

| | | |
|---|---|---|
| JP | 2012-029206 | 2/2012 |
| JP | 2012-065167 | 3/2012 |

* cited by examiner

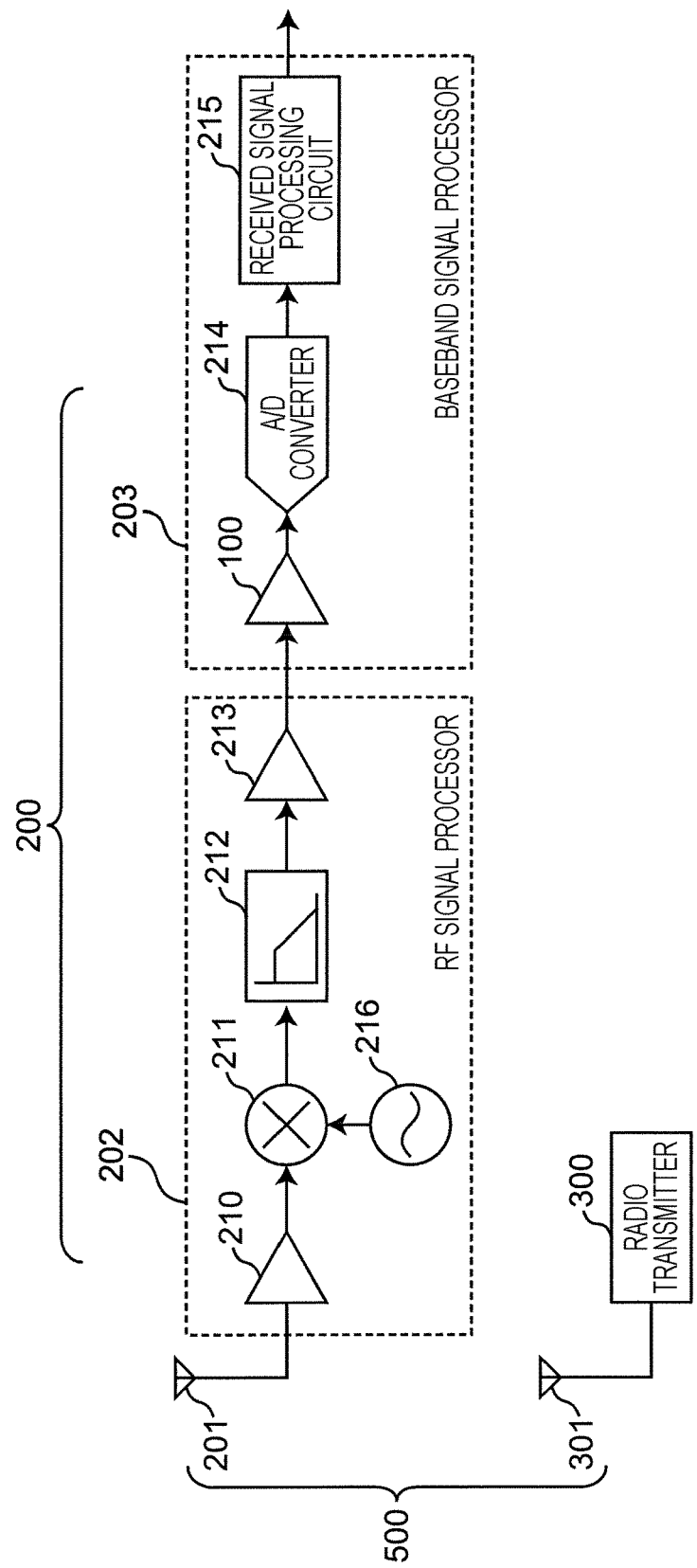

DIFFERENTIAL AMPLIFIER CIRCUIT AND RADAR DEVICE

BACKGROUND

1. Technical Field

The present disclosure relates to a differential amplifier circuit and a radar device.

2. Description of the Related Art

The signal processing speed of millimeter wave communication systems or radar devices has been rapidly increased in recent years. Such a system includes an antenna, an RF signal processor that processes signals in the electromagnetic wave frequency range, and a baseband signal processor that processes unmodulated or demodulated signals. As the RF signal processor increases the signal frequency and widens the signal processing band, the analog/digital converter (hereafter referred to as A/D converter) and signal processing circuit of the baseband signal processor are required to both improve the conversion accuracy and increase the conversion speed.

However, there is a limit to the speed increase of the single A/D converter. For this reason, there has been proposed a time-interleaved technology that arranges multiple A/D converters in parallel and that makes phase differences among the sampling timings thereof to increase the conversion speed in total. When inputting signals to such time-interleaved A/D converters, it is necessary to drive the load capacitances of the A/D converters to sample the signals fast. Sampling the signals fast requires disposing an input buffer so as to precede the A/D converters. For example, Japanese Unexamined Patent Application Publication No. 2012-65167 discloses a system in which time-interleaved A/D converters are connected through a source-follower input buffer.

In systems as described above, the signal is a high-frequency signal and therefore the RF circuit or A/D converters often includes low withstand-voltage transistors (core transistors), which are able to respond fast. A circuit including low withstand-voltage transistors is driven when connected to a low power-supply voltage of the order of 0.8 to 1.2 V. For this reason, the amplitude of output signals from the RF signal processor is reduced to the order of 0.2 to 0.5 V, and the amplitude of signals that can be processed by the following baseband signal processor is also reduced. On the other hand, depending on the type, the A/D converters can receive signals having an amplitude corresponding to approximately the entire power-supply voltage range. For this reason, in many cases, the signals are amplified in an amplifier circuit preceding the A/D converters to improve signal-to-noise ratio (SNR) characteristics.

As amplifier circuits required to respond fast, open-loop amplifier circuits have been increasingly used thanks to their high power efficiency and stability in recent years. For example, U.S. Pat. No. 6,750,715 disc discloses a differential amplifier circuit that is an open-loop amplifier circuit and is for use in radio communication systems required to respond fast.

SUMMARY

One non-limiting and exemplary embodiment provides a differential amplifier circuit that is able to receive and output voltages.

In one general aspect, the techniques disclosed here feature a differential amplifier circuit including first and second input terminals that receive differential input voltages, first and second output terminals that output output voltages, a first transistor including a source terminal, a drain terminal, and a gate terminal connected to the first input terminal, a second transistor including a source terminal, a drain terminal, and a gate terminal connected to the second input terminal, a first resistor connected between the source terminal of the first transistor and the source terminal of the second transistor, a third transistor including a drain terminal connected to the source terminal of the first transistor, a gate terminal connected to the drain terminal of the first transistor, and a source terminal connected to the first output terminal, a fourth transistor including a drain terminal connected to the source terminal of the second transistor, a gate terminal connected to the drain terminal of the second transistor, and a source terminal connected to the second output terminal, a first current source connected between the source terminal of the first transistor and a power-supply voltage, a second current source connected between the source terminal of the second transistor and the power-supply voltage, a second resistor including a first terminal connected to the source terminal of the third transistor, a third resistor including a first terminal connected to the source terminal of the fourth transistor, a third current source connected between the drain terminal of the first transistor and a ground, and a fourth current source connected between the drain terminal of the second transistor and the ground.

The differential amplifier circuit of the one aspect of the present disclosure is able to receive and output voltages.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 7 is a block diagram showing an example configuration of a radar device according to a fourth embodiment of the present disclosure.

DETAILED DESCRIPTION

The output circuit of a fast-operating RF signal processor and the A/D converter of a fast-operating baseband signal processor are both driven when connected to a low power-supply voltage. If an amplifier circuit is connected between these elements, the amplifier circuit is required to receive and output voltages in a low-voltage range. For example, if the amplifier circuit described in U.S. Pat. No. 6,750,715 is used as the differential input unit of an n-channel metal oxide semiconductor (MOS) transistor (hereafter referred to as an NMOS transistor), it is able to output voltages in a low-voltage range but is able to receive only high voltages. On the other hand, if this amplifier circuit is used as the differential input unit of a p-channel MOS transistor (hereafter referred to as a PMOS transistor), it is able to receive only low voltages and to output only high voltages. As seen above, conventional amplifier circuits are not able to both input and output voltages in a low-voltage range. For this reason, the present inventors have intensively conducted research to provide a differential amplifier circuit that is able to input and output low voltages without degrading linearity and responsiveness.

Now, embodiments of the present disclosure will be described in detail with reference to the accompanying drawings. Identical or equivalent elements are given the same reference signs and will not be described repeatedly.

First Embodiment

Figure 1:
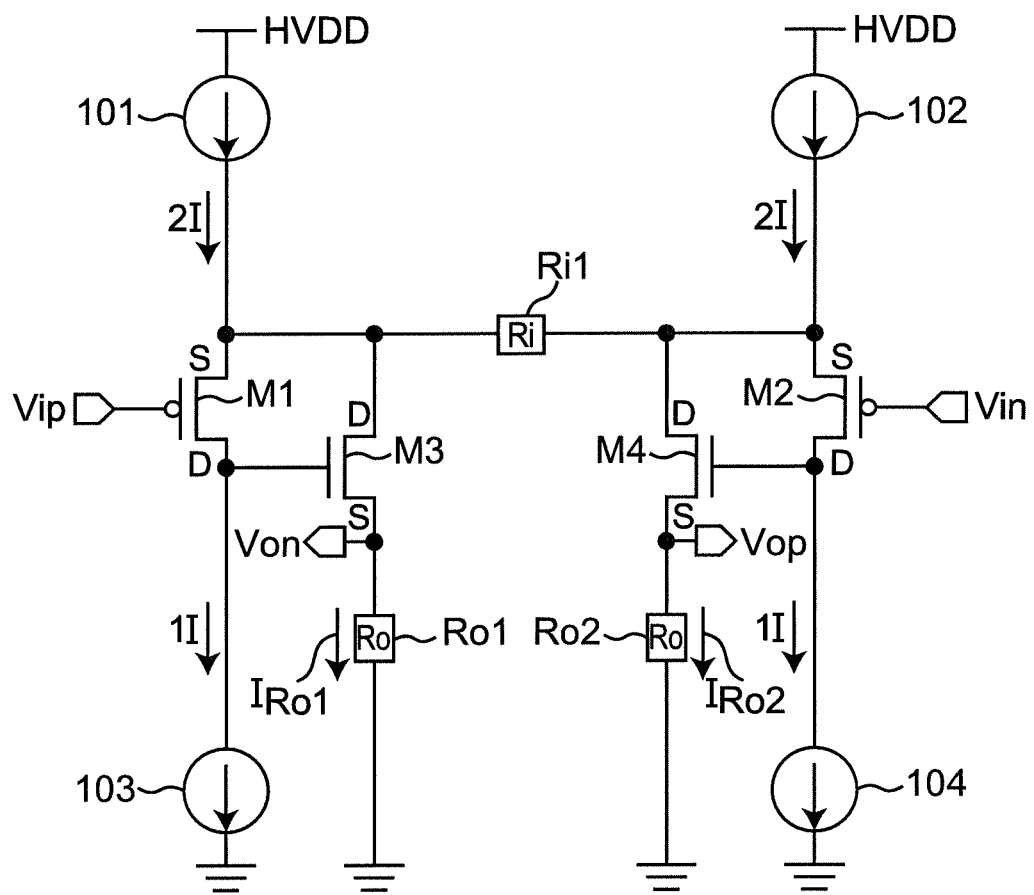
FIG. 1 is a circuit diagram showing an example configuration of a differential amplifier circuit according to a first embodiment of the present disclosure.

FIG. 1 is a circuit diagram showing an example configuration of a differential amplifier circuit 100 according to a first embodiment of the present disclosure. The differential amplifier circuit 100 in FIG. 1 includes PMOS transistors M1, M2, NMOS transistors M3, M4, an input resistive element Ri1, output resistive elements Ro1, Ro2, and current sources 101 to 104.

In FIG. 1, differential input voltages Vip, Vin are inputted to the gate terminals of the differential input PMOS transistors M1, M2, respectively. The current source 101 is connected between the source terminal of the differential input PMOS transistor M1 and a high power-supply voltage HVDD (to be detailed later). The current source 102 is connected between the source terminal of the differential input PMOS transistor M2 and the high power-supply voltage HVDD. The source terminal of the differential input PMOS transistor M1 is connected to the drain terminal of the NMOS transistor M3 serving as feedback. The source terminal of the differential input PMOS transistor M2 is connected to the drain terminal of the NMOS transistor M4 serving as feedback. The input resistive element Ri1 is connected between the source terminals of the differential input PMOS transistors M1, M2.

The drain terminal of the differential input PMOS transistor M1 is connected to the gate terminal of the NMOS transistor M3. The drain terminal of the differential input PMOS transistor M2 is connected to the gate terminal of the NMOS transistor M4. The current source 103 is connected between the drain terminal of the differential input PMOS transistor M1 and the ground (the ground potential). The current source 104 is connected between the drain terminal of the differential input PMOS transistor M2 and the ground. The output resistive element Ro1 is connected between the source terminal of the NMOS transistor M3 and the ground. The output resistive element Ro2 is connected between the source terminal of the NMOS transistor M4 and the ground. The source terminals of the NMOS transistors M3, M4 are connected to output terminals Von, Vop, respectively.

As shown in FIG. 1, the current sources 101, 102 each provides, for example, a current 2×I as a bias current. The current sources 103, 104 each provides, for example, a current 1×I as a bias current. If the PMOS transistors M1, M2 have the same size and impedance; the NMOS transistors M3, M4 have the same size and impedance; the output resistive elements Ro1, Ro2 have the same impedance; and the input voltages Vip, Vin are the same, then a current 1×I passes through each of the output resistive elements Ro1, Ro2. The then output voltages Von, Vop are obtained by the following formula using the resistance value Ro of the output resistive elements Ro1, Ro2.

$$Vop=Von=1\times I\times Ro \quad (1)$$

For example, assume that a potential difference +V1 is made between the input voltages Vip, Vin. The constant currents 1×I from the current sources 103, 104 are passing through the differential input PMOS transistors M1, M2. Thus, the gate-source voltages of the PMOS transistors M1, M2 are approximately constant. For this reason, the potential difference +V1 is transmitted from the gate to the source of the differential input PMOS transistor M1 and from the gate to the source of the differential input PMOS transistor M2. Thus, the potential difference across the input resistive element Ri1 becomes approximately +V1. Due to the potential difference +V1, currents $I_{Ro1}$, $I_{Ro2}$ flowing through the output resistive elements Ro1, Ro2 are obtained by the following formulas.

$$I_{Ro1}=1\times I-V1/Ri \quad (2)$$

$$I_{Ro2}=1\times I+V1/Ri \quad (3)$$

In these formulas, Ri represents the resistance value of the input resistive element Ri1. Since voltage drops occur due to the currents $I_{Ro1}$, $I_{Ro2}$, the output potentials Von, Vop are obtained by the following formulas.

$$Von\approx Ro(1\times I-V1/Ri) \quad (4)$$

$$Vop\approx Ro(1\times I+V1/Ri) \quad (5)$$

The then differential output voltage (Vop-Von) is obtained by the following formula.

$$Vop-Von\approx Ro(1\times I+V1/Ri)-Ro(1\times I-V1/Ri)=V1\times 2\times Ro/Ri \quad (6)$$

As is apparent in Formula (6), the input-output gain of the differential amplifier circuit 100 is approximately determined by the resistance ratio of the output resistive element to the input resistive element, Ro/Ri. In other words, the gain G of the differential amplifier circuit 100 does not depend on the transistor characteristics. Thus, the differential amplifier circuit 100 is able to obtain gain characteristics that are less likely to be affected by the operating temperature, power-supply voltage, or process variations.

For example, if the resistance values Ri, Ro are the same, the differential amplifier circuit 100 is able to obtain approximately a double signal gain. Depending on the settings of the resistance values Ri, Ro, the gain of the differential amplifier circuit 100 can be made smaller than 1.

Figure 2:
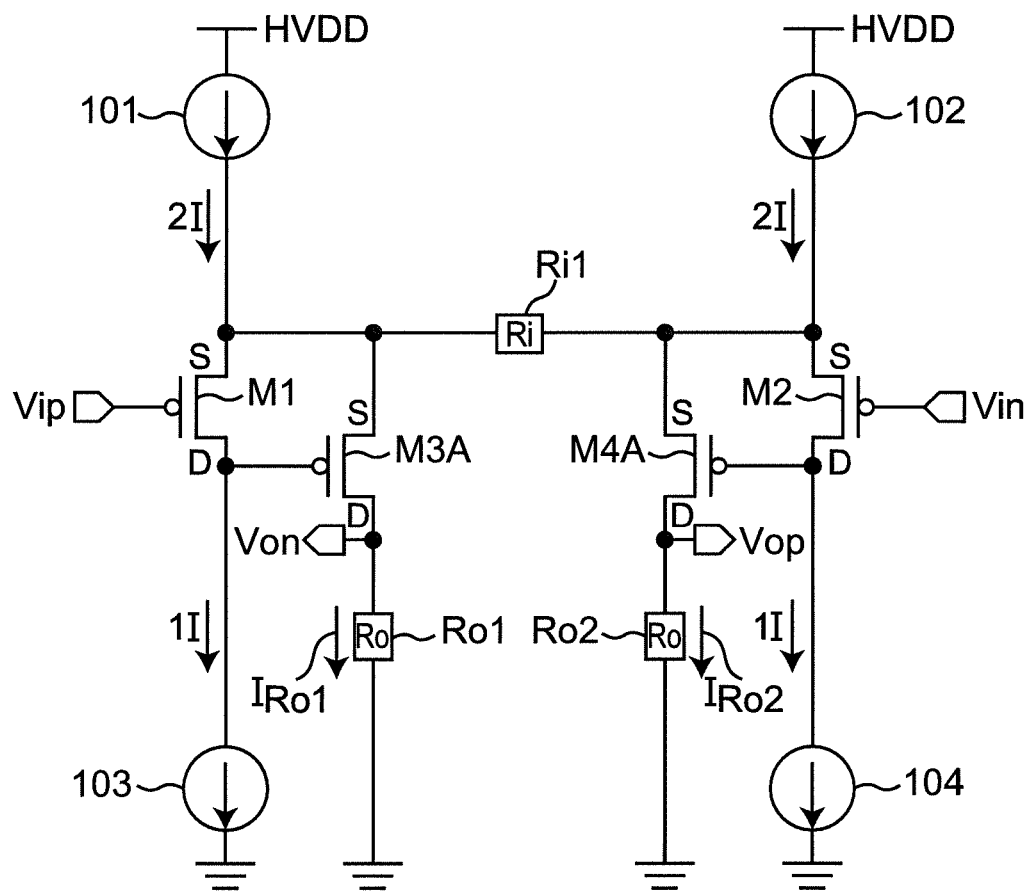
FIG. 2 is a circuit diagram showing an example configuration of a differential amplifier circuit according to a modification of the first embodiment of the present disclosure.

FIG. 2 is a circuit diagram showing an example configuration of a differential amplifier circuit 100A according to a modification of the first embodiment of the present disclosure. The differential amplifier circuit 100A in FIG. 2 differs from the differential amplifier circuit 100 in FIG. 1 in that PMOS transistors are used for feedback in place of the NMOS transistors M3, M4. The other elements are the same or similar to those of the differential amplifier circuit 100. That is, the differential amplifier circuit 100A in FIG. 2 has the same structure as that of the differential amplifier circuit 100 in FIG. 1 except for including PMOS transistors M3A, M4A in lieu of the NMOS transistors M3, M4. The source terminal of the PMOS transistor M3A is connected to the source terminal of a PMOS transistor M1; the gate terminal of the PMOS transistor M3A to the drain terminal of the PMOS transistor M1; and the drain terminal of the PMOS transistor M3A to an output terminal Von. The source terminal of the PMOS transistor M4A is connected to the source terminal of a PMOS transistor M2; the gate terminal of the PMOS transistor M4A to the drain terminal of the PMOS transistor M2; and the drain terminal of the PMOS transistor M4A to an output terminal Vop.

In FIGS. 1 and 2, the resistive elements Ri1, Ro1, Ro2 are any type of devices for realizing desired resistance values and may be MOS transistors. The current sources 101 to 104 may be current mirrors of MOS transistors. The current sources 101 to 104 may also have cascode configurations. Thus, the accuracy of the current sources 101 to 104 can be increased. As a result, it is possible to reduce variations in the currents flowing through the current sources 101 to 104 and to suppress the degradation of the linearity of the differential amplifier circuits 100, 100A.

The output terminals of the differential amplifier circuit 100 or 100A are connected to, for example, A/D converters including low withstand-voltage MOS transistors (core transistors) capable of fast operation. Thus, the recent fast operation requirement can be met. A typical process allows for the coexistence of high withstand-voltage transistors and low withstand-voltage transistors, and the low withstand-voltage transistors are able to operate faster. As a type of A/D converter, time-interleaved successive comparison A/D converters have been increasingly used thanks to their high power efficiency in recent years.

A successive comparison A/D converter is able to receive voltages in the almost entire range of a low power-supply voltage LVDD (on the order of 0.8 to 1.2 V) used as the power-supply voltage of a low withstand-voltage MOS transistor. For this reason, the preceding differential amplifier circuit 100 or 100A is also desirably able to output voltages in the entire low withstand-voltage power-supply voltage range. However, if the differential amplifier circuit 100 or 100A has a low withstand-voltage power supply connected thereto, it has difficulty in outputting analog signals in the entire low withstand-voltage power-supply voltage range. For this reason, the differential amplifier circuit 100 or 100A includes high withstand-voltage MOS transistors and has the high power-supply voltage HVDD (on the order of 1.5 to 3.6 V) connected thereto. Thus, the differential amplifier circuit 100 or 100A is able to output voltages in the entire low withstand-voltage power-supply voltage range.

Figure 3:
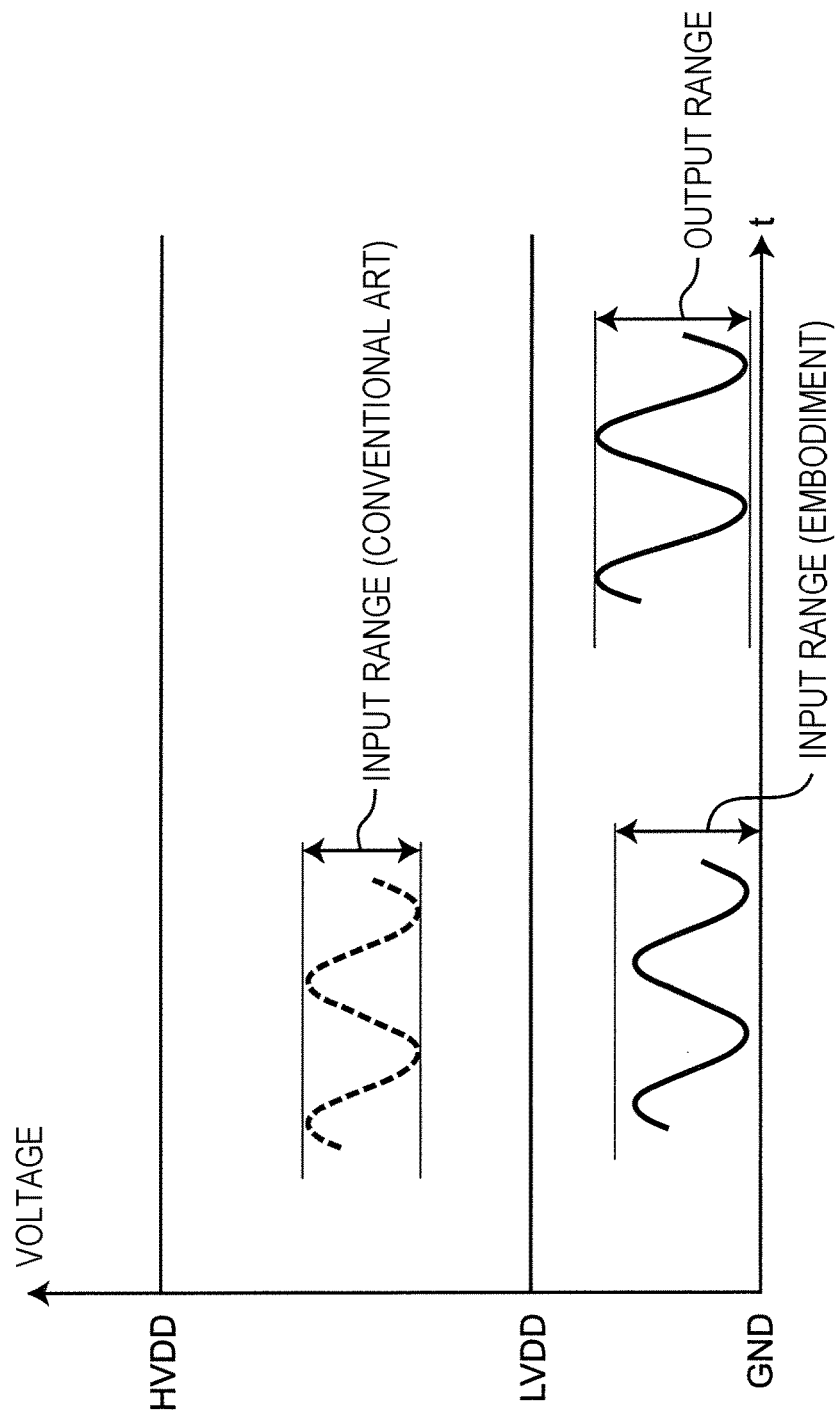
FIG. 3 is a voltage waveform diagram showing the operation of the differential amplifier circuits in FIGS. 1 and 2.

FIG. 3 is a voltage waveform diagram showing the operation of the differential amplifier circuits 100, 100A in FIGS. 1 and 2. Described below is an example operation of the differential amplifier circuit 100 or 100A including high withstand-voltage MOS transistors. FIG. 3 shows the ranges of voltages that the differential amplifier circuits 100, 100A are able to receive and output, with respect to the high power-supply voltage HVDD, low power-supply voltage LVDD, and ground. Note that the power-supply voltage of the differential amplifier circuits 100, 100A is the high power-supply voltage HVDD.

In the differential amplifier circuits 100, 100A in FIGS. 1 and 2, the PMOS transistors M1, M2 serve as differential input units and therefore the input voltage ranges of the gate terminals thereof include voltages near the ground (the ground potential). That is, the differential amplifier circuits 100, 100A are able to receive voltages including those near the ground. Further, the output voltages Vop, Von are determined by the resistance value Ro of the output resistive elements Ro1, Ro2 connected to the ground and therefore the output voltage ranges also include voltages near the ground. That is, the differential amplifier circuits 100, 100A are able to output voltages including those near the ground. In conventional amplifier circuits, on the other hand, NMOS transistors serve as differential input units and have current sources connected to the ground sides thereof. Accordingly, those amplifier circuits are not able to receive voltages near the ground. Thanks to the circuit configurations of the present embodiment in FIGS. 1 and 2, the differential amplifier circuits 100 and 100A are able to match the input ranges thereof to the output range of the RF signal processor, as well as are able to match the output ranges thereof to the input ranges of the A/D converters and to widen the output ranges.

Second Embodiment

Figure 4:
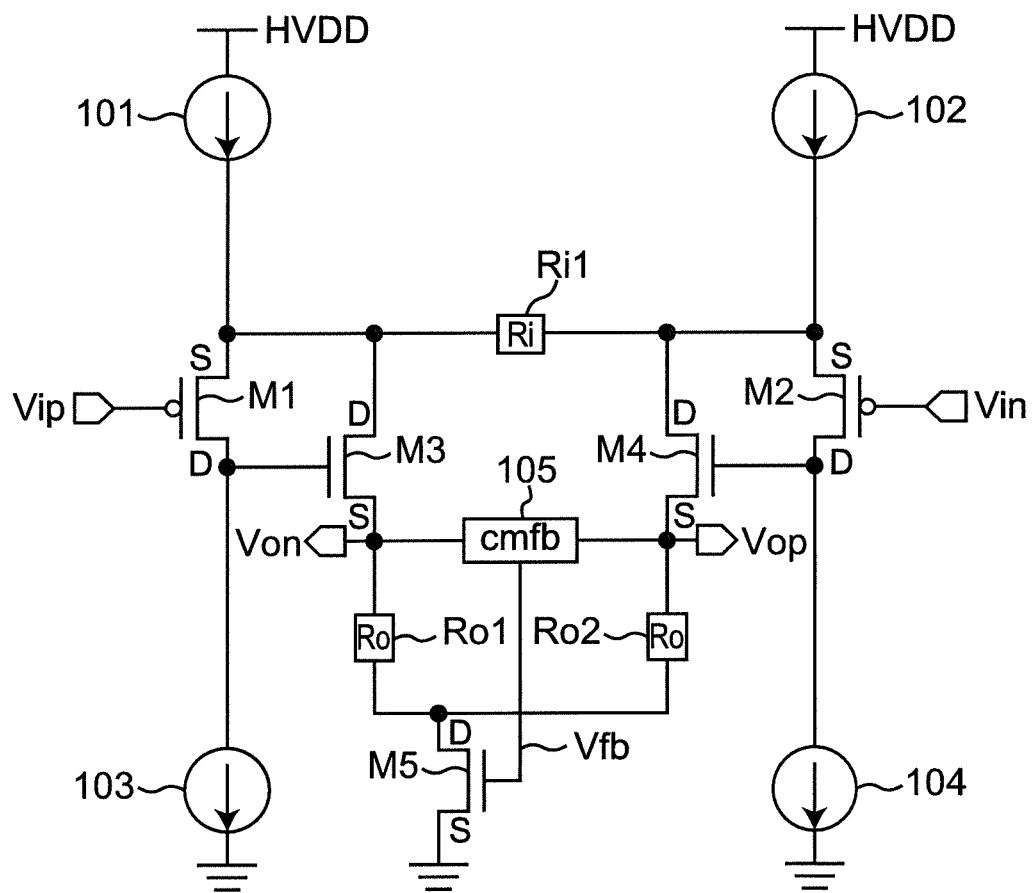
FIG. 4 is a circuit diagram showing an example configuration of a differential amplifier circuit according to a second embodiment of the present disclosure.

FIG. 4 is a circuit diagram showing an example configuration of a differential amplifier circuit 110 according to a second embodiment of the present disclosure. As with the differential amplifier circuit 100 of the first embodiment in FIG. 1, the differential amplifier circuit 110 in FIG. 4 includes PMOS transistors M1, M2, NMOS transistors M3, M4, resistive elements Ri1, Ro1, Ro2, and current sources 101 to 104. The differential amplifier circuit 110 differs from the differential amplifier circuit 100 in that it further includes a common-mode feedback circuit 105 and an NMOS transistor M5. This difference will be described below.

In FIG. 4, the ground-side terminals of the output resistive elements Ro1, Ro2 are connected to the drain terminal of the NMOS transistor M5. The source terminal of the NMOS transistor M5 is grounded. The common-mode feedback circuit 105 is connected between output terminals Von, Vop. The output terminal of the common-mode feedback circuit 105 is connected to the gate terminal of the NMOS transistor M5 so that an output voltage Vfb from the common-mode feedback circuit 105 is inputted to the gate terminal of the NMOS transistor M5.

While the differential amplifier circuit 110 of the second embodiment is formed by further incorporating the feedback circuit 105 and NMOS transistor M5 into the differential amplifier circuit 100 in FIG. 1, the present disclosure is not limited to this configuration. It may be formed by further incorporating the common-mode feedback circuit 105 and NMOS transistor M5 into the differential amplifier circuit 100A in FIG. 2. That is, the differential amplifier circuit 110 may include the PMOS transistors M3A, M4A in place of the NMOS transistors M3, M4. In this case, the source terminal of the PMOS transistor M3A is connected to the source terminal of the PMOS transistor M1; the gate terminal of the PMOS transistor M3A to the drain terminal of the PMOS transistor PMOS transistors M1; and the drain terminal of the PMOS transistor M3A to the output terminal Von. The source terminal of the PMOS transistor M4A is connected to the source terminal of the PMOS transistor M2; the gate terminal of the PMOS transistor M4A to the drain terminal of the PMOS transistor M2; and the drain terminal of the PMOS transistor M4A to the output terminal Vop.

Figure 5:
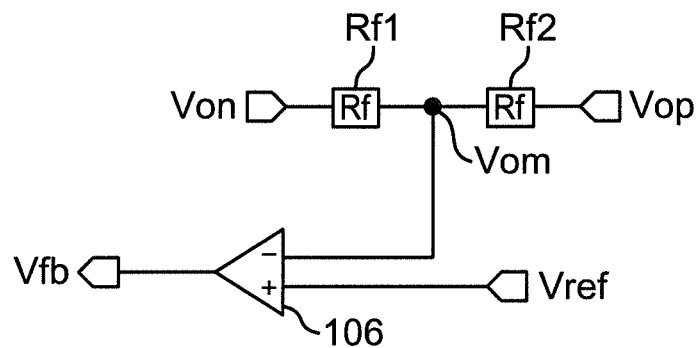
FIG. 5 is a circuit diagram showing an example configuration of a feedback circuit in FIG. 4.

FIG. 5 is a circuit diagram showing an example configuration of the feedback circuit 105 in FIG. 4. The feedback circuit 105 includes resistive elements Rf1, Rf2 and a differential amplifier 106. A circuit block in which the resistive elements Rf1, Rf2 are connected in series is disposed between the output terminals Vop, Von of the differential amplifier circuit 110. The inverted input terminal of the differential amplifier 106 is connected to the junction of the resistive elements Rf1, Rf2. A predetermined reference voltage Vref is applied to the non-inverted input terminal of the differential amplifier 106. The output voltage Vfb of the differential amplifier 106 is applied to the gate terminal VFB of the NMOS transistor M5.

If the same resistance value, Rf, is set for the resistive elements Rf1, Rf2 in the feedback circuit 105 in FIG. 5, the voltage of the junction of the resistive elements Rf1, Rf2 becomes the intermediate voltage Vom between the output voltages Vop, Von. In other words, the resistive elements Rf1, Rf2 form a voltage output circuit that outputs the intermediate voltage Vom. The differential amplifier 106 compares the intermediate voltage Vom with a predetermined reference voltage Vref and feeds a voltage Vfb corresponding to the comparison result back to the gate terminal of the NMOS transistor M5. This feedback system operates so that Vom=Vref. Thus, the intermediate voltage Vom between the output voltages Von, Vop can be controlled so as to become the predetermined reference voltage Vref. For example, if the resistance value Ro of the output resistive elements Ro1, Ro2 is set to the order of 100Ω, the resistive elements Rf1, Rf2 are desirably set to several KΩ, which is a very high resistance value with respect to the order of 100Ω.

While, in the first and second embodiments, the differential amplifier circuits 100, 100A, 110 include high withstand-voltage transistors, the differential input MOS transistors M1, M2 may be low withstand-voltage transistors which are driven by the low power-supply voltage LVDD, which is lower than the high power-supply voltage HVDD. Thus, the frequency bands of the differential amplifier circuits 100, 100A, 110 can be widened. If the input voltages Vin, Vip are set to relatively low voltages, the voltages among the drain, gate, and source terminals of the PMOS transistors M1, M2 can be driven by potential differences equal to or lower than the upper limit of the low withstand-voltage transistors. Similarly, the NMOS transistors M3, M4 may also be low withstand-voltage transistors. As seen above, if the differential amplifier circuits 100, 100A, 110 are connected to the high power-supply voltage HVDD and only the elements important to the band characteristics (that is, only M1 and M2 or only M1 to M4) are low withstand-voltage transistors, the differential amplifier circuits 100, 100A, 110 are able to operate in a wide voltage range and to obtain wide-band characteristics.

Third Embodiment

Figure 6:
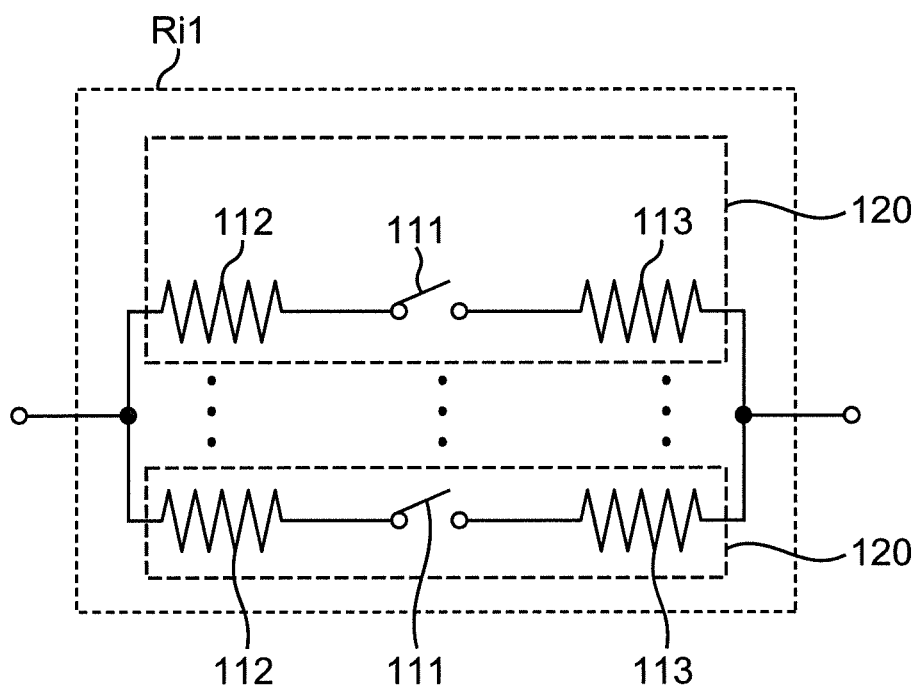
FIG. 6 is a circuit diagram showing an example configuration of an input resistive element that is a variable resistor for a differential amplifier circuit according to a third embodiment of the present disclosure.

FIG. 6 is a circuit diagram showing an example configuration of an input resistive element Ri1 for a differential amplifier circuit according to a third embodiment of the present disclosure. In FIG. 6, the input resistive element Ri1 includes, for example, multiple circuit blocks 120 that are connected in parallel. Each circuit block 120 includes a resistive element 112, a switch 111, and a resistive element 113 that are connected in series. By turning on or off each switch 111, it is possible to change the number of parallel resistors to change the resistance value of the resistive element Ri1. Thus, the gains G of the differential amplifier circuits 100, 100A, 110 can be changed.

Fourth Embodiment

FIG. 7 is a block diagram showing an example configuration of a radar device 500 according to a fourth embodiment of the present disclosure. Referring to FIG. 7, there will be described a case in which any one of the differential amplifier circuits 100, 100A, 110 described in the first to third embodiments is disposed in a baseband signal processor 203 of a radio receiver 200 of the radar device 500.

In FIG. 7, the radar device 500 includes a radio transmitter 300 including an antenna 301 and the radio receiver 200 including an antenna 201. The radio transmitter 300 transmits a radar high-frequency signal toward a predetermined reflecting object through the antenna 301. The reflected wave reflected by the reflecting object is received by the radio receiver 200 through the antenna 201.

The radio receiver 200 includes an RF signal processor 202 and the baseband signal processor 203. The RF signal processor 202 including an LNA circuit 210, a mixer circuit 211, a local oscillation circuit 216, a filter circuit 212, and a driver circuit 213. The baseband signal processor 203 includes the differential amplifier circuit 100 (or 100A or 110), an A/D converter circuit 214, and a received signal processing circuit 215.

In the RF signal processor 202, the LNA circuit 210 low-noise amplifies the high-frequency signal from the antenna 201 and then outputs the resulting high-frequency signal to the mixer circuit 211. The mixer circuit 211 mixes a local oscillation signal from the local oscillation circuit 216 with the high-frequency signal. The filter circuit 212 extracts an intermediate-frequency signal from the mixed signal. In this way, the high-frequency signal is converted into the intermediate-frequency signal. The driver circuit 213, which is an intermediate-frequency amplifier, amplifies the extracted intermediate-frequency signal and then outputs the resulting signal to the differential amplifier circuit 100.

In the baseband signal processor 203, the differential amplifier circuit 100 amplifies the intermediate-frequency signal and then outputs the resulting signal to the A/D converter circuit 214. The A/D converter circuit 214 converts the analog intermediate-frequency signal into a digital signal and outputs the digital signal to the received signal processing circuit 215. The received signal processing circuit 215 performs received signal processing such as addition on the digital signal to detect the direction of the reflecting object or the like and then outputs the detection result.

By using the differential amplifier circuit 100, 100A, or 110 of the first or second embodiment as the differential amplifier circuit 100 in FIG. 7, the voltage level of the signal outputted from the RF signal processor 202 and the voltage level of the signal inputted to the baseband signal processor 203 can be equalized. Thus, received signal processing can be performed.

MODIFICATION

While, in the above embodiments, the PMOS transistors M1, M2 are used as the differential input units of the differential amplifier circuits 100, 100A, 110, the present disclosure is not limited to this configuration. NMOS transistors or bipolar transistors may be used. Also, in the present disclosure, there is no restriction on the configuration of the resistive element.

While, in the fourth embodiment, any one of the differential amplifier circuits 100, 100A, 110 of the first to third embodiments is disposed in the radio receiver 200 of the radar device 500, the present disclosure is not limited to this configuration. The differential amplifier circuit 100 or the like can be applied to any type of electronic device.

SUMMARY OF EMBODIMENTS

A differential amplifier circuit of one aspect of the present disclosure includes:

first and second input terminals that receive differential input voltages;

first and second output terminals that output output voltages;

a first transistor including a source terminal, a drain terminal, and a gate terminal that is connected to the first input terminal;

a second transistor including a source terminal, a drain terminal, and a gate terminal that is connected to the second input terminal;

a first resistor connected between the source terminal of the first transistor and the source terminal of the second transistor;

a third transistor including a drain terminal connected to the source terminal of the first transistor, a gate terminal connected to the drain terminal of the first transistor, and a source terminal connected to the first output terminal;

a fourth transistor including a drain terminal connected to the source terminal of the second transistor, a gate terminal connected to the drain terminal of the second transistor, and a source terminal connected to the second output terminal;

a first current source connected between the source terminal of the first transistor and a power-supply voltage;

a second current source connected between the source terminal of the second transistor and the power-supply voltage;

a second resistor including a first terminal connected to the source terminal of the third transistor;

a third resistor including a first terminal connected to the source terminal of the fourth transistor;

a third current source connected between the drain terminal of the first transistor and a ground; and a fourth current source connected between the drain terminal of the second transistor and the ground.

The first and second transistors may be p-channel MOS transistors. The fourth and fifth transistors may be n-channel MOS transistors.

The second resistor may include a second terminal connected to the ground. The third resistor may include a second terminal connected to the ground.

The differential amplifier circuit may further include a fifth transistor and a feedback circuit. The fifth transistor may include a gate terminal, a drain terminal, and a source terminal that is connected to the ground. The feedback circuit may be connected between the first terminal of the second resistor and the first terminal of the third resistor. The second resistor may include a second terminal connected to the drain terminal of the fifth transistor. The third resistor may include a second terminal connected to the drain terminal of the fifth transistor. The feedback circuit may include an output terminal connected to the gate terminal of the fifth transistor.

The feedback circuit may include a voltage output circuit that outputs an intermediate voltage between a voltage of the first output terminal and a voltage of the second output terminal and a differential amplifier that compares the intermediate voltage from the voltage output circuit with a predetermined reference voltage and that outputs a voltage corresponding to a comparison result.

The power-supply voltage may be a second power-supply voltage that is higher than a predetermined first power-supply voltage. The first and second transistors may be transistors that are driven by the first power-supply voltage.

The first resistor may include multiple circuit blocks that are connected in parallel. The circuit blocks may each include a circuit in which a fourth resistor, a first switch, and a fifth resistor are connected in series.

A differential amplifier circuit of another aspect of the present disclosure includes:

first and second input terminals that receive differential input voltages;

first and second output terminals that output output voltages;

a first transistor comprising a source terminal, a drain terminal, and a gate terminal that is connected to the first input terminal;

a second transistor comprising a source terminal, a drain terminal, and a gate terminal that is connected to the second input terminal;

a first resistor connected between the source terminal of the first transistor and the source terminal of the second transistor;

a third transistor comprising a source terminal connected to the source terminal of the first transistor, a gate terminal connected to the drain terminal of the first transistor, and a drain terminal connected to the first output terminal;

a fourth transistor comprising a source terminal connected to the source terminal of the second transistor, a gate terminal connected to the drain terminal of the second transistor, and a drain terminal connected to the second output terminal;

a first current source connected between the source terminal of the first transistor and a power-supply voltage;

a second current source connected between the source terminal of the second transistor and the power-supply voltage;

a second resistor comprising a first terminal connected to the drain terminal of the third transistor;

a third resistor comprising a first terminal connected to the drain terminal of the fourth transistor;

a third current source connected between the drain terminal of the first transistor and a ground; and a fourth current source connected between the drain terminal of the second transistor and the ground.

The first to fourth transistors may be p-channel MOS transistors.

The second resistor may include a second terminal connected to the ground. The third resistor may include a second terminal connected to the ground.

The differential amplifier circuit may further include a fifth transistor and a feedback circuit. The fifth transistor may include a gate terminal, a drain terminal, and a source terminal that is connected to the ground. The feedback circuit may be connected between the first terminal of the second resistor and the first terminal of the third resistor. The second resistor may include a second terminal connected to the drain terminal of the fifth transistor. The third resistor may include a second terminal connected to the drain terminal of the fifth transistor. The feedback circuit may include an output terminal connected to the gate terminal of the fifth transistor.

The feedback circuit may include a voltage output circuit that outputs an intermediate voltage between a voltage of the first output terminal and a voltage of the second output terminal and a differential amplifier that compares the intermediate voltage from the voltage output circuit with a predetermined reference voltage and that outputs a voltage corresponding to a comparison result.

The power-supply voltage may be a second power-supply voltage that is higher than a predetermined first power-supply voltage. The first and second transistors may be transistors that are driven by the first power-supply voltage.

The first resistor may include multiple circuit blocks that are connected in parallel. The circuit blocks may each include a circuit in which a fourth resistor, a first switch, and a fifth resistor are connected in series.

A radar device of yet another aspect of the present disclosure includes an antenna that receives a radar signal, an RF signal processing circuit that converts the radar signal received by the antenna into an intermediate-frequency signal, and any one of the differential amplifier circuits that receive the intermediate-frequency signal from the RF signal processing circuit as differential input voltages.

The differential amplifier circuits of the present disclosure are able to both receive and output low voltages without degrading linearity and responsiveness. These differential amplifier circuits are useful, particularly in systems that process high-frequency signals, such as radar devices.

What is claimed is:

1. A differential amplifier circuit comprising:
   first and second input terminals that receive differential input voltages;
   first and second output terminals that output output voltages;
   a first transistor comprising a source terminal, a drain terminal, and a gate terminal that is connected to the first input terminal;
   a second transistor comprising a source terminal, a drain terminal, and a gate terminal that is connected to the second input terminal;
   a first resistor connected between the source terminal of the first transistor and the source terminal of the second transistor;
   a third transistor comprising a drain terminal connected to the source terminal of the first transistor, a gate terminal connected to the drain terminal of the first transistor, and a source terminal connected to the first output terminal;
   a fourth transistor comprising a drain terminal connected to the source terminal of the second transistor, a gate terminal connected to the drain terminal of the second transistor, and a source terminal connected to the second output terminal;
   a first current source connected between the source terminal of the first transistor and a power-supply voltage;
   a second current source connected between the source terminal of the second transistor and the power-supply voltage;
   a second resistor comprising a first terminal connected to the source terminal of the third transistor;
   a third resistor comprising a first terminal connected to the source terminal of the fourth transistor;
   a third current source connected between the drain terminal of the first transistor and a ground; and
   a fourth current source connected between the drain terminal of the second transistor and the ground.

2. The differential amplifier circuit of claim 1, wherein the first and second transistors are p-channel MOS transistors, and
   the fourth and fifth transistors are n-channel MOS transistors.

3. The differential amplifier circuit of claim 1, wherein the second resistor comprises a second terminal connected to the ground, and
   the third resistor comprises a second terminal connected to the ground.

4. The differential amplifier circuit of claim 1, further comprising:
   a fifth transistor comprising a gate terminal, a drain terminal, and a source terminal that is connected to the ground; and
   a feedback circuit connected between the first terminal of the second resistor and the first terminal of the third resistor, wherein
   the second resistor comprises a second terminal connected to the drain terminal of the fifth transistor;
   the third resistor comprises a second terminal connected to the drain terminal of the fifth transistor, and
   the feedback circuit comprises an output terminal connected to the gate terminal of the fifth transistor.

5. The differential amplifier circuit of claim 4, wherein the feedback circuit comprises:
   a voltage output circuit that outputs an intermediate voltage between a voltage of the first output terminal and a voltage of the second output terminal; and
   a differential amplifier that compares the intermediate voltage from the voltage output circuit with a predetermined reference voltage and that outputs a voltage corresponding to a comparison result.

6. The differential amplifier circuit of claim 1, wherein the power-supply voltage is a second power-supply voltage that is higher than a predetermined first power-supply voltage, and
   the first and second transistors are transistors that are driven by the first power-supply voltage.

7. The differential amplifier circuit of claim 1, wherein the first resistor comprises a plurality of circuit blocks that are connected in parallel, and
   the circuit blocks each include a circuit in which a fourth resistor, a first switch, and a fifth resistor are connected in series.

8. A radar device comprising:
   an antenna that receives a radar signal;
   an RF signal processing circuit that converts the radar signal received by the antenna into an intermediate-frequency signal; and
   a differential amplifier circuit, wherein
   the differential amplifier circuit comprises:
       first and second input terminals that receive the intermediate-frequency signal from the RF signal processing circuit as differential input voltages;
       first and second output terminals that output output voltages;
       a first transistor comprising a source terminal, a drain terminal, and a gate terminal that is connected to the first input terminal;
       a second transistor comprising a source terminal, a drain terminal, and a gate terminal that is connected to the second input terminal;
       a first resistor connected between the source terminal of the first transistor and the source terminal of the second transistor;
       a third transistor comprising a drain terminal connected to the source terminal of the first transistor, a gate terminal connected to the drain terminal of the first transistor, and a source terminal connected to the first output terminal;
       a fourth transistor comprising a drain terminal connected to the source terminal of the second transistor, a gate terminal connected to the drain terminal of the second transistor, and a source terminal connected to the second output terminal;
       a first current source connected between the source terminal of the first transistor and a power-supply voltage;
       a second current source connected between the source terminal of the second transistor and the power-supply voltage;

a second resistor comprising a first terminal connected to the source terminal of the third transistor;
a third resistor comprising a first terminal connected to the source terminal of the fourth transistor;
a third current source connected between the drain terminal of the first transistor and a ground; and
a fourth current source connected between the drain terminal of the second transistor and the ground.

9. A differential amplifier circuit comprising:
first and second input terminals that receive differential input voltages;
first and second output terminals that output output voltages;
a first transistor comprising a source terminal, a drain terminal, and a gate terminal that is connected to the first input terminal;
a second transistor comprising a source terminal, a drain terminal, and a gate terminal that is connected to the second input terminal;
a first resistor connected between the source terminal of the first transistor and the source terminal of the second transistor;
a third transistor comprising a source terminal connected to the source terminal of the first transistor, a gate terminal connected to the drain terminal of the first transistor, and a drain terminal connected to the first output terminal;
a fourth transistor comprising a source terminal connected to the source terminal of the second transistor, a gate terminal connected to the drain terminal of the second transistor, and a drain terminal connected to the second output terminal;
a first current source connected between the source terminal of the first transistor and a power-supply voltage;
a second current source connected between the source terminal of the second transistor and the power-supply voltage;
a second resistor comprising a first terminal connected to the drain terminal of the third transistor;
a third resistor comprising a first terminal connected to the drain terminal of the fourth transistor;
a third current source connected between the drain terminal of the first transistor and a ground; and
a fourth current source connected between the drain terminal of the second transistor and the ground.

10. The differential amplifier circuit of claim 9, wherein the first to fourth transistors are p-channel MOS transistors.

11. The differential amplifier circuit of claim 9, wherein the second resistor comprises a second terminal connected to the ground, and
the third resistor comprises a second terminal connected to the ground.

12. The differential amplifier circuit of claim 9, further comprising:
a fifth transistor comprising a gate terminal, a drain terminal, and a source terminal that is connected to the ground; and
a feedback circuit connected between a first terminal of the second resistor and a first terminal of the third resistor, wherein
the second resistor comprises a second terminal connected to the drain terminal of the fifth transistor;
the third resistor comprises a second terminal connected to the drain terminal of the fifth transistor, and
the feedback circuit comprises an output terminal connected to the gate terminal of the fifth transistor.

13. The differential amplifier circuit of claim 12, wherein the feedback circuit comprises:
a voltage output circuit that outputs an intermediate voltage between a voltage of the first output terminal and a voltage of the second output terminal; and
a differential amplifier that compares the intermediate voltage from the voltage output circuit with a predetermined reference voltage and that outputs a voltage corresponding to a comparison result.

14. The differential amplifier circuit of claim 9, wherein the power-supply voltage is a second power-supply voltage that is higher than a predetermined first power-supply voltage, and
the first and second transistors are transistors that are driven by the first power-supply voltage.

15. The differential amplifier circuit of claim 9, wherein the first resistor comprises a plurality of circuit blocks that are connected in parallel, and
the circuit blocks each include a circuit in which a fourth resistor, a first switch, and a fifth resistor are connected in series.

16. A radar device comprising:
an antenna that receives a radar signal;
an RF signal processing circuit that converts the radar signal received by the antenna into an intermediate-frequency signal; and
a differential amplifier circuit, wherein
the differential amplifier circuit comprises:
first and second input terminals that receive the intermediate-frequency signal from the RF signal processing circuit as differential input voltages;
first and second output terminals that output output voltages;
a first transistor comprising a source terminal, a drain terminal, and a gate terminal that is connected to the first input terminal;
a second transistor comprising a source terminal, a drain terminal, and a gate terminal that is connected to the second input terminal;
a first resistor connected between the source terminal of the first transistor and the source terminal of the second transistor;
a third transistor comprising a source terminal connected to the source terminal of the first transistor, a gate terminal connected to the drain terminal of the first transistor, and a drain terminal connected to the first output terminal;
a fourth transistor comprising a source terminal connected to the source terminal of the second transistor, a gate terminal connected to the drain terminal of the second transistor, and a drain terminal connected to the second output terminal;
a first current source connected between the source terminal of the first transistor and a power-supply voltage;
a second current source connected between the source terminal of the second transistor and the power-supply voltage;
a second resistor comprising a first terminal connected to the drain terminal of the third transistor;
a third resistor comprising a first terminal connected to the drain terminal of the fourth transistor;
a third current source connected between the drain terminal of the first transistor and a ground; and
a fourth current source connected between the drain terminal of the second transistor and the ground.

* * * * *